United States Patent [19]
Khang

[11] Patent Number: 5,963,494
[45] Date of Patent: Oct. 5, 1999

[54] SEMICONDUCTOR MEMORY HAVING BITLINE PRECHARGE CIRCUIT

[75] Inventor: Chang-Man Khang, Kyonggi-do, Rep. of Korea

[73] Assignee: LG Semicon Co., Ltd., Cheongju, Rep. of Korea

[21] Appl. No.: 09/258,788

[22] Filed: Mar. 1, 1999

Related U.S. Application Data

[63] Continuation of application No. 09/126,600, Jul. 31, 1998, Pat. No. 5,883,845.

[51] Int. Cl.[6] .................................................. G11C 13/00
[52] U.S. Cl. ........................................... 365/203; 365/204
[58] Field of Search .............................. 365/185.01, 203, 365/204, 189.01, 230.01, 185.1

[56] References Cited

U.S. PATENT DOCUMENTS

| | | | |
|---|---|---|---|
| 4,184,207 | 1/1980 | McElroy | 365/185.01 |
| 4,967,395 | 10/1990 | Watanabe et al. | 365/203 |
| 5,168,462 | 12/1992 | Takeuchi et al. | 365/51 |
| 5,394,354 | 2/1995 | Watabe et al. | 365/51 |
| 5,491,435 | 2/1996 | Mun et al. | 327/55 |
| 5,652,730 | 7/1997 | Kono et al. | |

*Primary Examiner*—Terrell W. Fears
*Attorney, Agent, or Firm*—Fleshner & Kim

[57] ABSTRACT

A semiconductor device is provided having a symmetric bitline precharge circuit. Sizes of a parasitic devices near transistors lying symmetrically in the bitline precharge circuit are symmetrical to each other. Further, a layout area occupied by the bitline precharge circuit or a chip is reduced or minimized by the symmetric layout. The device can include a memory having first and second bitline extending in parallel a first direction a bitline precharge voltage supplying line and a bitline equalizing signal line extending in parallel in a second direction perpendicular to the first direction. A gate has at least a first part extending in the first direction, a second part having a first predetermined length extending in the second direction coupled to the first part and a third part having a second predetermined length extending in the second direction coupled to the first part with contact areas at uncoupled ends. An active region is on portions of the first and second bitline, the bitline precharge voltage supplying line, the first part and the second part of the gate. A first contact located between the first and second bitline to electrically couples the bitline precharge voltage supplying line and the active region. Second and third contacts electrically couple the gate to the bitline equalizing signal line, and fourth and firth contacts electrically couple the first and the second bitlines to the active region.

18 Claims, 3 Drawing Sheets

SEMICONDUCTOR MEMORY HAVING BITLINE PRECHARGE CIRCUIT

This application is a continuation of Ser. No. 09/126,600 filed Jul. 31, 1998, now U.S. Pat. No. 5,883,845.

BACKGROUND OF THE INVENTION

1. Field of the Invention

The present invention relates to a semiconductor device, and in particular, to a semiconductor memory having a bitline precharge circuit.

2. Background of the Related Art

FIG. 1 shows portions of a related art DRAM memory cell array, a bitline precharge circuit connected to the array and sense amplifiers. Each of the bitlines BL0,/BL0, BL1 and/ BL1 consist of two parts 'B1' and 'B2' that are connected by NMOS transistors Q1 to Q4, which are bitline isolation switching devices. The 'B1' and 'B2' parts are connected electrically only when the NMOS transistors Q1 to Q4 are enabled (i.e., an ON-state).

The 'B1' is a portion of the bitline connected to the memory cell array MC1 to MC4, etc. When a bitline precharge voltage VBLP of VDD/2 is applied to bitline precharge circuit BLP0 and BLP1 and a bitline equalizing signal /BEQi is activated to low level, the 'B1' part is precharged by the voltage of VDD/2.

The 'B2' of the bitlines includes sense amplifiers S/A0 and S/A1. After being amplified in the sense amplifiers S/A0 and S/A1 to the voltage level of VDD and VSS respectively, the data having been loaded in the 'B1' is supplied to the 'B2'. NMOS transistors Q5 to Q8 are switching devices between the 'B2' of the bitline and the data bus. The data having been loaded in the 'B2' is loaded in the data bus DB and /DB as soon as the NMOS transistors Q5 to Q8 are enabled (i.e., an ON-state).

As described above, the reason the 'B1' of the bitline connected to the memory cell array is precharged to the level of VDD/2 is that the time required for reading each data of '1' and '0' is well balanced. If the bitlines BL and /BL were precharged to the level of VDD, the time required for reading the data of '0' is much longer than the time required for reading the data of '1'. Such asymmetry prevents optimizing the DRAM operation. However, the time required for reading the data of '1' is the same as '0' while the bitlines BL and /BL are precharged with the voltage of VDD/2, which optimizes the DRAM operation.

Accordingly, an actual voltage level of the data loaded from the memory cell to the bitlines is not high because the capacitance of the storage capacitor of the memory cell is very small to increase integration, increase capacity and to provide a high DRAM operating speed. Even though the data is loaded in the bitline has been precharged, the voltage level has little variation. Having detected the slight variation, the sense amplifier amplifies the slight voltage level variation. Consequently, the accurate precharge and the equalization of the bitlines has a great significance in DRAM.

FIG. 2 shows the circuit of the blocks denoted by 100 and 200 in detail. Referring to FIG. 2, two NMOS transistors Q10 and Q11 are connected in series between the bitlines BL0 and /BL0, and the other NMOS transistor Q12 is connected in parallel to the two NMOS transistors Q10 and Q11 between the bitlines BL0 and /BL0. The bitline precharge voltage is supplied to a node at which the drains of the NMOS transistors Q10 and Q11 are reciprocally connected. The gates of the NMOS transistors Q10 to Q12 are regulated by the bitline equalizing signal /BEQi. The bitline equalizing signal /BEQi decided by a DRAM /RAS signal becomes low level as soon as the /RAS signal becomes low level, whereby the precharge and the equalizing operation are not performed. When the /RAS signal becomes high level and the bitline equalizing signal /BEQi becomes high level, the bitlines are precharged and also equalized.

In particular, the bitline precharge voltage VBLP is supplied to the bitlines BL0 and /BL0 by the NMOS transistors Q10 and Q11 of the block 100, which have become on-state according to the high level bitline equalizing signal /BEQi. Simultaneously, the voltage levels of the bitlines BL0 and /BL0 are equalized by electrically shorting the bitlines BL0 and /BLO when the NMOS transistor Q12 becomes enabled according to the bitline equalizing signal /BEQi. In the circuit of the block 200 in FIG. 2, the same precharge and the same equalizing operation are also carried out by the bitline equalizing signal /BEQi.

Further, there are parasitic capacitance and resistance existing in the two bitline precharge circuits, i.e. the blocks 100 and 200 respectively shown in FIG. 2. The parasitic capacitance existing in the bitline precharge circuit, the NMOS transistors Q1 and Q2, the signal lines and the power lines will now be described. The parasitic capacitances Ca1 to Ca6 appear between each of the electrodes such as gates, sources and drains of the NMOS transistors Q10 to Q12. Additional parasitic capacitances C10–C11 and C13–C14 exist within the area defined by the lines of the bitlines BL0 and /BL0, the bitline precharge voltage supplying line 4, and the bitline isolation signal line 6.

Parasitic resistances R10 to R16 appear in the electrodes of each NMOS transistors such as gates, sources and drains, the area surrounded by the lines of the bitlines BL0 and /BLO, the bitline precharge voltage supplying line 4 and the bitline isolation signal line 6. Additional parasitic resistances R17 and R18 also exist between the bitline equalizing signal 5 and the gates of the NMOS transistors Q10 and Q11. The bitline precharge circuit of the block 200 has the same parasitic capacitances and resistances as the block 100.

Normal operation of the circuit will not occur in the DRAM bitline precharge circuit if the parasitic capacitance or the parasitic resistance has different values. The parasitic capacitance and resistance in a semiconductor integrated circuit cannot be excluded completely. Pairs of capacitances such as the capacitances Ca1 and Ca4 and the capacitances Ca2 and Ca3 exist if the origin of the parasitic capacitance is taken as a reference point. The bitlines BL0, /BL0, BL1 and /BL1 are unable to be precharged evenly to the voltage level of VDD/2 unless the values of two parasitic capacitances are identical to each other.

As described above, the related art bitline precharge circuit has various problems. Asymmetry of parasitic capacitance or resistance is primarily caused by the layout pattern in the actual circuit formed on the wafer. Thus, values of corresponding parasitic resistances or capacitances supposed to be symmetric are not identical to each other unless the layout of the circuit is designed symmetrically. Further, asymmetry of the layout pattern causes inefficiency of a circuit layout because of the undesirably enlarged layout area and prevents very high integration.

The above references are incorporated by reference herein where appropriate for appropriate teachings of additional or alternative details, features and/or technical background.

SUMMARY OF THE INVENTION

An object of the present invention is to provide semiconductor memory having bitline precharge circuit that substantially obviates one or more problems caused by limitations and disadvantages of the related art.

Another object of the present invention is to provide a symmetric layout design for bitline precharge circuits where sizes of parasitic devices near the symmetrically-formed transistors are symmetric to corresponding parasitic devices.

Another object of the present invention is to reduce an area occupied by the bitline precharge circuit by symmetry of the bitline precharge circuit layout.

Another object of the present invention is to provide a bitline precharge circuits that provides symmetric parasitic capacitances and resistances.

Another object of the present invention is to provide a bitline precharge circuits that implements extreme symmetry to allow normal operations.

To achieve at least these objects and other advantages and in accordance with the purpose of the present invention, as embodied and broadly described, a semiconductor memory having bitline precharge circuit includes a first and second bitline arranged in parallel to a first direction wherein the bitlines separated from each other in a certain distance, a bitline precharge voltage supplying line to a second direction perpendicular to the first direction, a gate having a first part to the first direction and a second part having a certain length to the second direction wherein the second part lies symmetrically with reference to one end of the first part and the second part has a first and second contact area at its both ends respectively, a bitline equalizing signal line to the second direction on a straight line connecting the first contact area to the second contact area, an active region on portions of the first, second bitline, the bitline precharge voltage supplying line, the first part and the second part, a first contact between the first and second bitline on both bitline precharge voltage supplying line and active region wherein the first contact connects the precharge voltage supplying line electrically to the active region, a second contact on a crossing point between the first contact area and the bitline equalizing signal line wherein the second contact connects the gate electrically to the bitline equalizing signal line, a third contact on the other crossing point between the second contact area and the bitline equalizing signal line wherein the third contact connects the gate electrically to the bitline equalizing signal line, a fourth contact on both first bitline and active region wherein the fourth contact connects the first bitline to the active region, and a fifth contact on both second bitline and active region wherein the fifth contact connects the second bitline to the active region.

To further achieve these objects and other advantages in a whole or in parts and in accordance with the purpose of the present invention, as embodied and described, a semiconductor memory having a bitline precharge circuit and a first and second bitline isolation switching device includes a first bitline extending in a first direction, said first bitline divided into a first and second part of said first bitline, a second bitline in parallel with said first bitline, said second bitline divided into a first and second part of said second bitline, a bitline precharge voltage line extending in a second direction substantially perpendicular to the first direction, a first gate having a first part extending in the second direction and a second part. having a prescribed length extended in the first direction from the first part, wherein both uncoupled ends of the second part have respective first and second contact areas, and wherein the second part is symmetric with reference to one end of the first part, a bitline equalizing signal line extending in the second direction connecting the first and second contact areas, a second gate having a first part extending in the first direction and a second part having a second prescribed length extended in the second direction from the first part, wherein the uncoupled end of the second part has a third contact area, and wherein the second part is symmetric with reference to one end of the first part of the second gate, an active region on portions of said second parts of said first and second bitlines, said bitline precharge voltage supplying line and said second part of said gate, a bitline isolation signal line extending in the second direction, said bitline isolation signal line electrically coupled to said third contact area, a first contact electrically coupling the bitline precharge voltage line to the active region, wherein the first contact is between said first and second bitline over both said bitline precharge voltage supplying line and said active re-ion, second and third contacts electrically coupling the gate to said bitline equalizing signal line, wherein the second and third contacts are respectively where the bitline equalizing signal line crosses the first and second contact areas, fourth and fifth contacts respectively on said first part of the first and second bitlines to electrically couple the first parts of said first and second bitlines to said active region, sixth and seventh contacts respectively on said second part of the first and second bitlines to electrically couple the said second parts of the first and second bitlines to said active region and an eighth contact on the third contact area, wherein the eighth contact electrically couples the second gate to the bitline isolation signal line.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
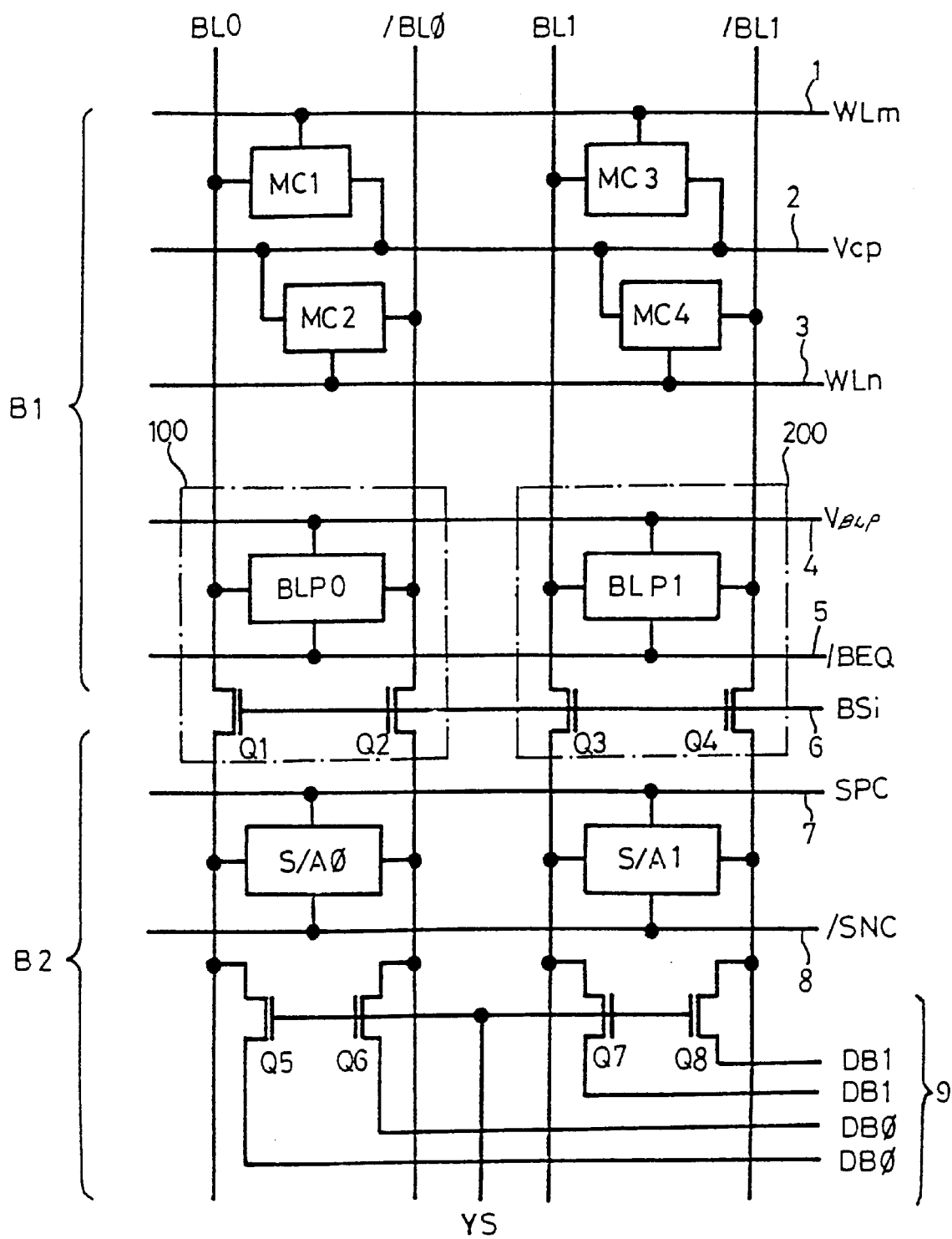
FIG. 1 is a diagram that shows a related art DRAM memory cell array.
Figure 2:
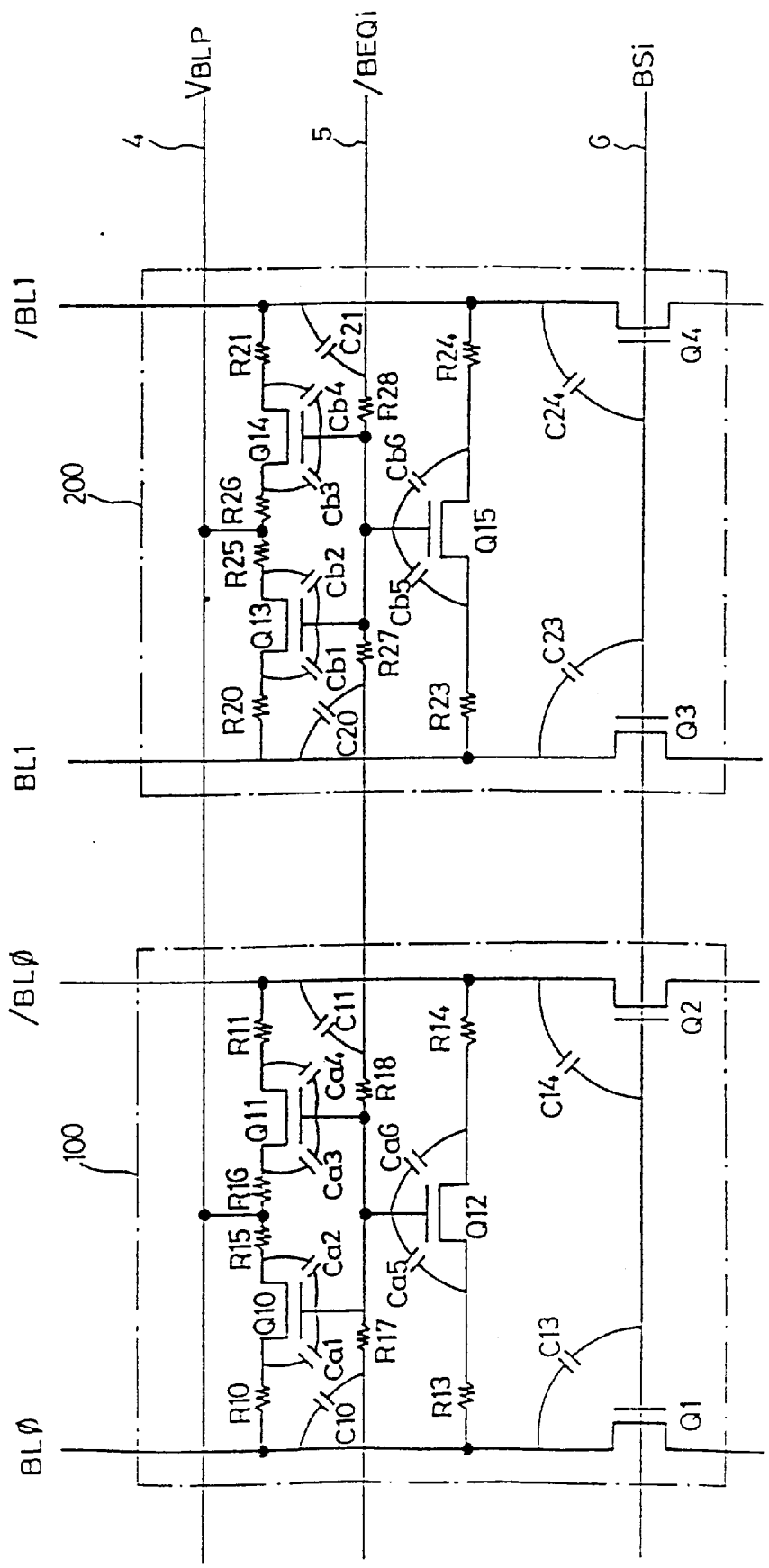
FIG. 2 is a diagram that shows a bitline precharge circuit of FIG. 1.
Figure 3:
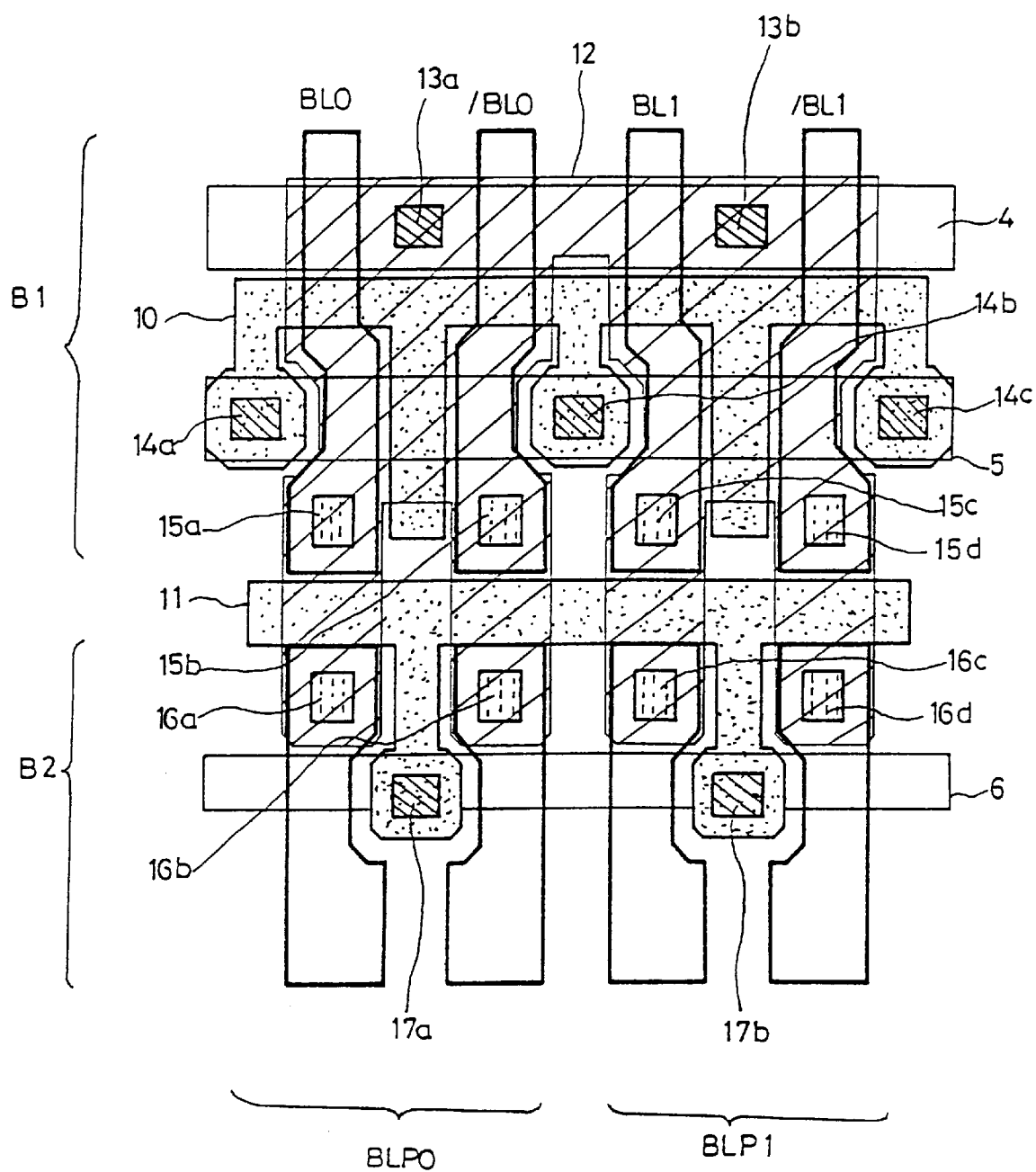
FIG. 3 is a diagram that shows a preferred embodiment of a bitline precharge circuit according to the present invention.

FIG. 3 is a diagram that shows a layout of a first preferred embodiment of bitline precharge circuits according to the present invention. As shown in FIG. 3, the first preferred embodiment includes bitline precharge circuits BLP0 and BLP1 that include NMOS transistors Q1 to Q4 for bitline isolation. Four bitlines BL0, /BL0, BL1 and /BL1 preferably made of metal are arranged at regular intervals in parallel extending along a first direction. The bitlines BL0, /BL0, BL1 and /BL1 are divided into two independent parts 'B1' and 'B2' by the bitline isolation transistors Q1 and Q4. A pair of bitlines BL0 and /BL0 have a symmetric shape and the other pair of bitlines BL1 and /BL1 also have a symmetric shape. Moreover, each bitline pair is symmetric to each other.

A bitline precharge voltage supplying line 4 extending along a second direction is substantially perpendicular to the bitlines BL0, /BL0, BL1 and /BL1. A gate 10 preferably made of polysilicon is denoted by dots in FIG. 3. The gate 10 includes three parts. A first part is perpendicular and a second part is parallel to the bitlines BL0, /BL0, BL1 and /BL1. The first part perpendicular to the bitlines BL0, /BL0, BL1 and /BL1 is also parallel and neighboring to the bitline precharge voltage supplying line 4. The second part parallel to the bitlines BL0, /BL0, BL1 and /BL1 has two portions with a prescribed length between two bitlines BL0 and /BL0, or bitlines BL1 and /BL1 (e.g., a bitline pair). Accordingly, the gate 10 includes an overall shape of pi "Π" and a partial shape of "T" (i.e. in each bitline precharge circuit such as BLP0 and BLP1).

The third part of the gate 10 is parallel to the bitlines BL0, /BL0, BL1 and /BL1 and includes portions: (1) between two bitlines /BL0 and BL1; (2) to the left side of the bitline BL0; and (3) to the right side of the bitline /BL1 (e.g., three portions). The third part lying at the left side of the bitline BL0 and to the right side of the bitline /BL1 (i.e., a side opposite BL0) is shorter than the portions of the second part between the two bitline pairs BL0 and BL1. Contact areas are preferably formed at ends of the third part. Thus, the part of the gate 10 (e.g., the third part) having contact areas is shorter in length than the remainder of the gate without contact areas (e.g., the second part). A bitline equalizing signal line 5 preferably made of metal extends in a straight line over the three contact areas of the gate 10, substantially perpendicular to the bitlines BL0, /BL0, BL1 and /BL1.

Another gate 11 is also preferably made of polysilicon and includes a first part perpendicular to and a second part parallel to each bitline BL0, /BL0, BL1 and /BL1. The gate 11 also denoted by dots in FIG. 3. The first part of the gate 11 lies parallel to the bitline equalizing signal line 5. Portions of the second part of the gate 11 having a prescribed length lie between the two bitlines BL1 and /BL1, and also between the other two bitlines BL1 and /BL1. Two contact areas are formed at the respective ends of the second part of the gate 11.

The bitline isolation signal line 6 preferably made of metal extends in a straight line over the two contact areas of the gate 11 substantially perpendicular to the bitlines. Denoted by hatching in FIG. 3 is an active region 12 including a portion of the bitline precharge voltage supplying line 4, a portion of the bitlines BL0, /BL0, BL1 and /BL1 and portions of the gates 10 and 11.

Contacts 13a and 13b, which are preferably metal, electrically couple the bitline precharge supplying line 4 to the active region 12. The metal contacts 13a and 13b are preferably at a first site on the active region 12 lying between the two bitlines BL0 and /BL0 and at a second site on the active region 12 between the other two bitlines BL1 and /BL1 over the bitline precharge voltage supplying line 4. The metal contact 13a is used as a source electrode of the NMOS transistors Q10 and Q11. The metal contact 13b is used as a source electrode of NMOS transistors Q13 and Q14.

Each of preferably metal contacts 14a to 14c perform as gate contacts formed at the crossing point between each of the contact areas of the gate 10 (e.g., on the third part of the gate 10) and the bitline equalizing signal line 4. Each of preferably polycide contacts 15a to 15d is formed in 'B1 and each of preferably polycide contacts 16a to 16d is formed in 'B2' of the bitlines BL0, /BL0, BL1 and /BL1 respectively. The contacts are on the bitlines in the vicinity of the gate 11 electrically couple 'B1' to 'B2' for each of the bitlines BL0, /BL0, BL1 and /BL1.

The polycide contacts 15a to 15d are preferably used for the drain electrodes of NMOS transistors Q1 to Q4, respectively. The other polycide contacts 16a to 16d are preferably used for the source electrodes of the NMOS transistors Q1 to Q4, respectively.

A bitline isolation signal line 6 extends in a straight line from one contact area to the other of the gate 11 substantially to be perpendicular to the bitlines BL0, /BL0, BL1 and /BL1. Preferably metal contacts 17a and 17b are formed to electrically couple each of the contact areas of the gate 11 to the isolation signal line 6.

The contact 13a and the contact 15a respectively are a drain electrode and source electrode between which the gate 10 is located to form the NMOS transistor Q10. The same contact 13a and a second contact, e.g., the contact 15b are a drain and a source electrode between which the same gate 10 is located to form the NMOS transistor Q11. The contact 13b/the contact 15c and the contact 13b/the contact 15d are similarly coupled by the gate 10 to form two NMO transistors Q13 and Q14.

Further, four polycide contacts 15a to 15d are used to form two NMOS transistors Q12 and Q15 as source and drain electrodes. The NMOS transistor Q12 is made since the gate 10 is formed between two polycide contacts 15a and 15b. The NMOS transistor Q15 is formed since the gate 10 is located between the two polycides 15c and 15d. Four additional transistors (e.g., Q1 to Q4) are made with corresponding pairs of polycide contacts 15a to 15d and 16a to 16d having the gate 11 there between.

As described above, the preferred embodiments of the bitline charging circuit has various advantages. In the preferred embodiment, a plurality of transistors are made in complete symmetry since the gates 10 and 11 are equally formed among each bitline BL0, /BL0, BL1 and /BL1 of the bitline charging circuit. Further, the gates 10 and 11 have overall pi shapes and partial "T" shapes. Accordingly, the values of the parasitic capacitance and resistance between the gate and source electrodes and between the gate and drain electrodes become substantially identical to the corresponding parasitic capacitances and resistances since the distances between the gate and source electrode and between the gate and drain electrode are all the same with each other and are formed with the same corresponding relationship. In addition, each of the parasitic capacitances/resistances is equivalent to each of the symmetrical corresponding parasitic capacitances/resistances because the distances among each transistor and the bitlines, among each transistor and the bitline precharge voltage supplying line, among each transistor and the bitline equalizing signal line, and among each transistor and the bitline isolation signal line are symmetric.

Thus, the preferred embodiment of the present invention provides a reduced size symmetric layout design maximizing the number of transistors thereon by forming gates featuring T shapes in a bitline precharge circuit. As each of the bitlines is supplied with an equal prescribed precharge voltage, operating characteristics of the bitline precharge circuit becomes increasingly uniform and improved. Further, sizes of the parasitic devices of the symmetric transistors included in the bitline precharge circuit of the preferred embodiment are also symmetric to the symmetric correspondings and the sizes of the parasitic devices existing among each bitline and signal line.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A semiconductor circuit comprising:
   first and second bit lines formed in a first direction;
   a first potential signal line formed in a second direction, the first and second directions being substantially perpendicular;
   a first signal line formed in the second direction;
   first and second transistors, each transistor having first and second electrodes and a gate electrode, wherein the first electrode of said first and second transistors is coupled to the first potential signal line at a first node, the gate electrode of said first transistor is coupled to said first signal line at a first gate contact and the gate electrode of said second transistor is coupled to said first signal line a second gate contact, the second electrode of said first transistor is coupled to said first bit line at a second node and the second electrode of said second transistor is coupled to said second bit line at a third node, wherein a first distance from the first node to the first gate contact and a second distance from the first node to the second gate contact is substantially the same.

2. The semiconductor circuit of claim 1, wherein a third distance from the first gate contact to the second node and a fourth distance from the second gate contact to the third node are substantially the same.

3. The semiconductor circuit of claim 1, further comprising a third transistor having first and second electrodes and a gate electrode, the first and second electrodes of said third transistor being coupled to the second and third nodes, respectively, wherein said gate electrode of said first, second and third transistors comprises a first conductive layer having
   a first conductive portion formed in the first direction on the left side of said first bit line and coupled to the first gate contact,
   a second conductive portion formed in the first direction on the right side of said second bit line and coupled to the second gate contact,
   a third conductive portion formed in the first direction between said first and second bit lines and between the second and third nodes, said third conductive portion serving as the gate of said third transistor, and
   a fourth conductive portion coupling said first, second and third conductive portion in the second direction.

4. The semiconductor circuit of claim 3, wherein a length of said first and second conductive portions in the first direction is substantially the same.

5. The semiconductor circuit of claim 3, wherein a length of said third conductive portion is longer than a length of said first and second conductive portions in the first direction.

6. The semiconductor circuit of claim 3, wherein impedances to the left and right of the third conductive portion are substantially the same.

7. The semiconductor circuit of claim 3, wherein a planar layout to the left and right of the third conductive portion is substantially the same.

8. The semiconductor circuit of claim 3, further comprising:
   a second signal line formed in the second direction; and
   fourth and fifth transistors, each transistor having first and second electrodes and a gate electrode, the second electrode of the fourth and fifth transistors being coupled to the second and third nodes, respectively, the first electrode of the fourth transistor being coupled to said first bit line at a fourth node and the first electrode of said fifth transistor being coupled to said second bit line at a fifth node, and the gate electrode of said fourth and fifth transistors being coupled to said second signal line at a third gate contact, wherein a fifth distance from the second node to the fourth node and a sixth distance from the third node to the fifth node are substantially the same.

9. The semiconductor circuit of claim 8, wherein a seventh distance from the fourth node to the third gate contact and an eighth distance from the fifth node to the third gate contact are substantially the same, and wherein the gate electrode of said fourth and fifth transistors comprises a second conductive layer, wherein said second conductive layer includes:
   a first conductive portion formed in the second direction between the second and fourth nodes and between the third and fifth nodes, and
   a second conductive portion formed in the first direction between the first and second bit lines and coupled to the third gate contact.

10. The semiconductor circuit of claim 3, wherein said first, second and third transistors are NMOS transistors.

11. The semiconductor circuit of claim 1, further comprising:
    a second signal line formed in the second direction; and
    fourth and fifth transistors, each transistor having first and second electrodes and a gate electrode, the second electrode of the fourth and fifth transistors being coupled to the second and third nodes, respectively, the first electrode of the fourth transistor being coupled to said first bit line at a fourth node and the first electrode of said fifth transistor being coupled to said second bit line at a fifth node, and the gate electrode of said fourth and fifth transistors being coupled to said second signal line at a third gate contact.

12. The semiconductor circuit of claim 11, wherein a fifth distance from the second node to the fourth node and a sixth distance from the third node to the fifth node are substantially the same.

13. The semiconductor circuit of claim 12, wherein a seventh distance from the fourth node to the third gate contact and an eighth distance from the fifth node to the third gate contact are substantially the same.

14. The semiconductor circuit of claim 11, wherein the gate electrode of said fourth and fifth transistors comprises a second conductive layer, wherein said second conductive layer includes:
    a first conductive portion formed in the second direction between the second and fourth nodes and between the third and fifth nodes, and
    a second conductive portion formed in the first direction between the first and second bit lines and coupled to the third gate contact.

15. The semiconductor circuit of claim 14, wherein impedances to the left and right of the second conductive portion are substantially the same.

16. The semiconductor circuit of claim 14, wherein a planar layout to the left and right of the second conductive portion is substantially the same.

17. The semiconductor circuit of claim 11, wherein said second signal line is coupled for receiving a bit line isolation signal and said fourth and fifth transistors are NMOS transistors.

18. The semiconductor circuit of claim 1, wherein said first potential signal line is coupled for receiving a precharge voltage and said first signal line is coupled for receiving a bit line equalizing signal.

* * * * *